US008913350B2

(12) United States Patent
Watts et al.

(10) Patent No.: US 8,913,350 B2
(45) Date of Patent: Dec. 16, 2014

(54) METHOD AND SYSTEM FOR PROVIDING MAGNETIC TUNNELING JUNCTION ELEMENTS HAVING IMPROVED PERFORMANCE THROUGH CAPPING LAYER INDUCED PERPENDICULAR ANISOTROPY AND MEMORIES USING SUCH MAGNETIC ELEMENTS

(75) Inventors: Steven M. Watts, Mountain View, CA (US); Zhitao Diao, Fremont, CA (US); Xueti Tang, Fremont, CA (US)

(73) Assignee: Grandis, Inc., San Jose, CA (US)

( * ) Notice: Subject to any disclaimer, the term of this patent is extended or adjusted under 35 U.S.C. 154(b) by 1363 days.

(21) Appl. No.: 12/538,489

(22) Filed: Aug. 10, 2009

(65) Prior Publication Data

US 2011/0032644 A1 Feb. 10, 2011

(51) Int. Cl.

| | |
|---|---|
| ***G11B 5/33*** | (2006.01) |
| ***B82Y 40/00*** | (2011.01) |
| ***G11C 11/16*** | (2006.01) |
| ***H01L 43/08*** | (2006.01) |
| ***G01R 33/09*** | (2006.01) |
| ***B82Y 25/00*** | (2011.01) |
| ***H01F 41/30*** | (2006.01) |
| ***H01F 10/32*** | (2006.01) |
| *H01F 41/34* | (2006.01) |

(52) U.S. Cl.

CPC ............... *G01R 33/098* (2013.01); *B82Y 40/00* (2013.01); *G11C 11/16* (2013.01); *H01L 43/08* (2013.01); *B82Y 25/00* (2013.01); *H01F 41/307* (2013.01); *H01F 10/3254* (2013.01); *H01F 41/34* (2013.01)

USPC ....................................................... 360/324.2

(58) Field of Classification Search

None

See application file for complete search history.

(56) References Cited

U.S. PATENT DOCUMENTS

| | | | | |
|---|---|---|---|---|
| 6,020,000 | A | 2/2000 | Wong et al. | |
| 6,532,164 | B2 | 3/2003 | Redon et al. | |
| 6,611,405 | B1 | 8/2003 | Inomata et al. | |
| 6,760,243 | B2 | 7/2004 | Winograd et al. | |
| 6,829,161 | B2 | 12/2004 | Huai et al. | |
| 6,967,863 | B2 | 11/2005 | Huai | |
| 6,992,359 | B2 * | 1/2006 | Nguyen et al. | 257/421 |
| 7,057,921 | B2 | 6/2006 | Valet | |
| 7,088,609 | B2 | 8/2006 | Valet | |
| 7,101,600 | B1 | 9/2006 | Kim | |

(Continued)

OTHER PUBLICATIONS

Japanese abstract of publication No. 11-120758, Apr. 30, 1999, Non-volatile Random Access Memory, Eric Maiken.

(Continued)

*Primary Examiner* — David D Davis

(74) *Attorney, Agent, or Firm* — Convergent Law Group LLP

(57) ABSTRACT

A method and system for providing a magnetic element and a magnetic memory utilizing the magnetic element are described. The magnetic element is used in a magnetic device that includes a contact electrically coupled to the magnetic element. The method and system include providing pinned, nonmagnetic spacer, and free layers. The free layer has an out-of-plane demagnetization energy and a perpendicular magnetic anisotropy corresponding to a perpendicular anisotropy energy that is less than the out-of-plane demagnetization energy. The nonmagnetic spacer layer is between the pinned and free layers. The method and system also include providing a perpendicular capping layer adjoining the free layer and the contact. The perpendicular capping layer induces at least part of the perpendicular magnetic anisotropy in the free layer. The magnetic element is configured to allow the free layer to be switched between magnetic states when a write current is passed through the magnetic element.

20 Claims, 6 Drawing Sheets

(56) References Cited

U.S. PATENT DOCUMENTS

| | | | | |
|---|---|---|---|---|
| 7,106,624 | B2 | 9/2006 | Huai et al. | |
| 7,161,829 | B2 | 1/2007 | Huai et al. | |
| 7,190,611 | B2 | 3/2007 | Nguyen et al. | |
| 7,242,045 | B2 | 7/2007 | Nguyen et al. | |
| 7,486,551 | B1 | 2/2009 | Li et al. | |
| 7,489,541 | B2 | 2/2009 | Pakala et al. | |
| 7,502,249 | B1 | 3/2009 | Ding | |
| 7,532,505 | B1 | 5/2009 | Ding | |
| 2002/0105827 | A1 | 8/2002 | Redon et al. | |
| 2003/0007398 | A1 | 1/2003 | Daughton et al. | |
| 2003/0059588 | A1 | 3/2003 | Hannah et al. | |
| 2003/0227807 | A1 | 12/2003 | Nakamura et al. | |
| 2005/0040433 | A1 | 2/2005 | Nozieres et al. | |
| 2005/0104101 | A1 | 5/2005 | Sun et al. | |
| 2005/0174702 | A1 | 8/2005 | Gill | |
| 2007/0247764 | A1 * | 10/2007 | Lee et al. | 360/324.11 |

OTHER PUBLICATIONS

Albert, et al., "Polarized Current Switching of a CO Thin Film Nanomagnet", American Institute of Physics, 77(23):3809-11 (2000).

Berger, "Emission of spin waves by a magnetic multilayer traversed by a current", Physical Review B, 54(13)9953-58 (1996).

Katine, et al., "Current-Driven Magnetization Reversal and Spin-Wave Excitations in Co/Cu/Co Pillars", Physical Review Letters, 84(14):3149-52 (2000).

Nishimura, et al., "Magnetic tunnel junction device with perpendicular magnetization films for high-density magnetic random access memory", J. of Applied Physics, 90(8):5246-49 (2002).

Slonczewski, Conductance and exchange coupling of two ferromagnets separated by a tunneling barrier, Physical Review B, 39(10) :6995-7002 (1989).

Slonczewski, "Current-driven excitation of magnetic multilayers", J. of Magnetism and Magnetic Materials, 159:L1-L7 (1996).

Slonczewski, "Theory and Application of Exchange-Driven Switching", IEEE, pp. CE-02 (2000).

Office Action issued Apr. 2008 for U.S. Appl. No. 11/239,939.

Office Action issued Sep. 2008 for U.S. Appl. No. 11/239,939.

Office Action issued Jan. 2010 for U.S. Appl. No. 12/133,671.

Office Action issued Apr. 2009 for U.S. Appl. No. 12/133,671.

Office Action issued Mar. 2011 for U.S. Appl. No. 12/638,902.

PCT International Search Report and Written Opinion of the ISA, application No. PCT/US08/64794.

PCT International Search Report and Written Opinion of the ISA, application No. PCT/US08/663693.

PCT International Search Report and Written Opinion of the ISA, application No. PCT/US10/47941.

PCT International Search Report and Written Opinion of the ISA, application No. PCT/US10/59184.

* cited by examiner

METHOD AND SYSTEM FOR PROVIDING MAGNETIC TUNNELING JUNCTION ELEMENTS HAVING IMPROVED PERFORMANCE THROUGH CAPPING LAYER INDUCED PERPENDICULAR ANISOTROPY AND MEMORIES USING SUCH MAGNETIC ELEMENTS

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic elements written at least in part by a current driven through the magnetic element.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional tunneling barrier layer 18 is nonmagnetic and is, for example, a thin insulator such as MgO. The conventional seed layer(s) 12 are typically utilized to aid in the growth of subsequent layers, such as the AFM layer 14, having a desired crystal structure. Direct exposure of the conventional free layer 20 to the top contact 24 may result in a disordered interface, dead magnetic regions and enhanced damping. Consequently, the conventional capping layer 22 is provided directly on the free layer 20, prior to deposition of the top contact 24. This conventional cap acts as a diffusion block and improves the surface quality of the conventional free layer 24. The conventional capping layer 22 is typically made of materials such as Ta.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically or ferromagnetically coupled through thin conductive layers, such as Ru. In such a SAF, multiple magnetic layers interleaved with a thin layer of Ru may be used. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru.

Spin transfer torque may be used to write to the conventional MTJ 10. In particular, spin transfer torque rotates the magnetization 21 of the conventional free layer 20 to one of the two directions along its easy axis. When a write current is passed through the conventional MTJ 10 perpendicular to the plane of the layers, electrons may be spin polarized by transmission through or reflection from the conventional pinned layer 16. The spin transfer torque on the magnetization 21 of the conventional free layer 20 may be adequate to switch the conventional free layer 20 if a sufficient current is driven through the conventional MTJ 10. Therefore, the conventional free layer 20 may be written to the desired state. The conventional MTJ 10 may thus be used for data storage in an STT-RAM.

The conventional MTJ 10 is required to be thermally stable for use in STT-RAM. During periods of latency, when the conventional MTJ 10 is preserving a previously stored datum, the magnetization 21 of the conventional free layer 20 is not completely static. Instead, thermal fluctuations allow the magnetic moments within the conventional free layer 20 to oscillate and/or precess. The random nature of these fluctuations translates to the occurrence of generally rare, unusually large fluctuations. These fluctuations may result in the reversal of the magnetization 21 of the conventional free layer 20, making the conventional MTJ 10 unstable. The probability of such a reversal decreases with increases in the height of the energy barrier between the two stable orientations (along the x-axis as shown in FIG. 1) of the free layer magnetization 21. Thus, for a memory employing the conventional MTJ 10 to be thermally stable, the conventional MTJ 10 should have a sufficiently high energy barrier that the magnetization 21 of the conventional free layer 20 is not switched by such thermal fluctuations. This energy barrier is typically achieved through a magnetic anisotropy energy sufficient to retain the magnetization 21 in the direction it was written. This magnetic anisotropy of the free layer 20 is generally large, in plane and along a particular axis. For example, in the conventional MTJ 10 shown in FIG. 1, the anisotropy would be along a horizontal (easy) axis, allowing the free layer magnetization 21 to be stable when the magnetization 21 is stable along the x-axis in FIG. 1.

Although a large energy barrier is desired for thermal stability, a large energy barrier may adversely affect writeability of the conventional MTJ. In general, a larger energy barrier provided by the in plane, generally uniaxial anisotropy results in a larger switching current. A larger write current would be driven through the conventional MTJ to switch the magnetization 21 of the conventional free layer 20. Use of a larger write current is generally undesirable for a variety of reasons including, but not limited to, increased heat generated and the potential need for a larger transistor in a magnetic memory cell. Thus, thermal stability may be considered to be at odds with a reduced write current.

Accordingly, what is needed is a method and system that may improve the thermal stability of the spin transfer torque based memories. The method and system address such a need.

BRIEF SUMMARY OF THE INVENTION

The exemplary embodiments provide methods and systems for providing a magnetic element and a magnetic memory utilizing the magnetic element. The magnetic element is used in a magnetic device, such as a magnetic memory, that includes a contact electrically coupled to the magnetic element. The method and system include providing pinned, nonmagnetic spacer, and free layers. The free layer has an out-of plane demagnetization energy and a perpendicular magnetic anisotropy corresponding to a perpendicular anisotropy energy. The perpendicular anisotropy energy is less than the out-of-plane demagnetization energy. The nonmagnetic spacer layer is between the pinned and free layers. The method and system also include providing a perpendicular capping layer adjoining the free layer and the contact. The perpendicular capping layer is for inducing at least part of the perpendicular magnetic anisotropy in the free layer. The magnetic element is configured to allow the free layer to be switched between a plurality of stable magnetic states when a write current is passed through the magnetic element.

DETAILED DESCRIPTION OF THE INVENTION

Figure 1:
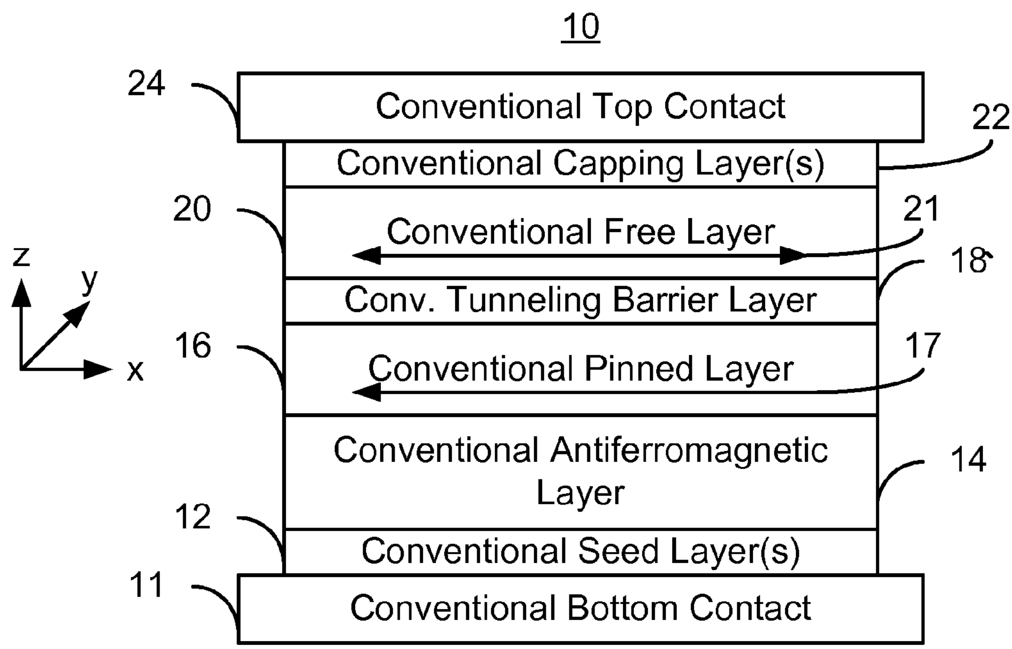
FIG. 1 depicts a conventional magnetic element.

The exemplary embodiments relate to magnetic elements usable in magnetic devices, such as magnetic memories, and the devices using such magnetic elements. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic element and a magnetic memory utilizing the magnetic element are described. The magnetic element is used in a magnetic device, such as a magnetic memory, that includes a contact electrically coupled to the magnetic element. The method and system include providing pinned, nonmagnetic spacer, and free layers. The free layer has an out-of-plane demagnetization energy and a perpendicular magnetic anisotropy corresponding to a perpendicular anisotropy energy that is less than the out-of-plane demagnetization energy. The nonmagnetic spacer layer is between the pinned and free layers. The method and system also include providing a perpendicular capping layer adjoining the free layer and the contact. The perpendicular capping layer is for inducing the perpendicular magnetic anisotropy in the free layer. The magnetic element is configured to allow the free layer to be switched between a plurality of stable magnetic states when a write current is passed through the magnetic element.

The exemplary embodiments are described in the context of particular magnetic elements and magnetic memories having certain components. One of ordinary skill in the art will readily recognize that the present invention is consistent with the use of magnetic elements and magnetic memories having other and/or additional components and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic elements having particular layers. However, one of ordinary skill in the art will readily recognize that magnetic elements having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements. Further, as used herein, "in-plane" is substantially within or parallel to the plane of one or more of the layers of a magnetic element. Conversely, "perpendicular" corresponds to a direction that is substantially perpendicular to one or more of the layers of the magnetic element.

Figure 2:
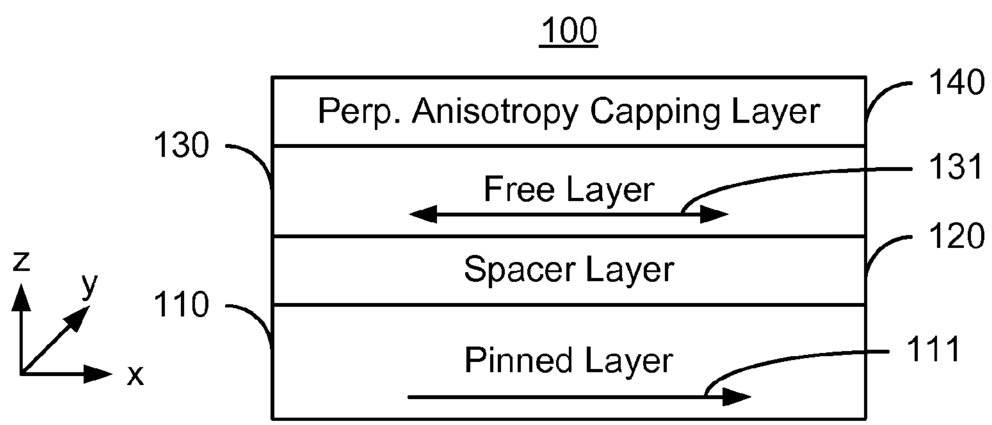
FIG. 2 depicts an exemplary of a magnetic element having improved thermal stability.

FIG. 2 depicts an exemplary of a magnetic element 100 having improved thermal stability. The magnetic element 100 is for use in a magnetic device, such as a magnetic memory, in which current is to be driven through the magnetic element 100. Consequently, such a device may include contacts (not shown in FIG. 2) through which current would be provided to and exit from the magnetic element 100. For clarity, FIG. 2 is not drawn to scale and some portions of the magnetic element 100 might be omitted. The magnetic element 100 includes a pinned layer 110, a spacer layer 120, free layer 130, and a perpendicular capping layer 140. The magnetic element 100 may also include seed layer(s) (not shown). In addition, the magnetic element 100 generally also includes a pinning structure, such as an AFM layer (not shown), which is used to fix, or pin, the magnetization of the pinned layer 110 in a desired direction.

The pinned layer 110 and the free layer 130 are magnetic and thus may include one or more of Ni, Fe, and Co, particularly in an alloy form. The magnetization 111 of the pinned layer 110 is fixed, or pinned, in a particular direction, typically by an exchange-bias interaction with an AFM layer (not shown). Although depicted as a simple layer with a single magnetization 111, the pinned layer 110 may include multiple layers. For example, the pinned layer 110 may be a SAF including magnetic layers antiferromagnetically or ferromagnetically coupled through thin layers, such as Ru. In such a SAF, multiple magnetic layers interleaved with thin layer(s) of Ru or other material may be used.

The spacer layer 120 is nonmagnetic. In some embodiments, the spacer layer 120 is an insulator, for example a tunneling barrier. In such embodiments, the spacer layer 120 may include crystalline MgO, which may enhance the tunneling magnetoresistance (TMR) of the magnetic element. In alternate embodiments, the spacer layer 120 might have another structure, for example a granular layer including conductive channels in an insulating matrix.

The free layer 130 has a changeable magnetization 131. Although depicted as a simple layer with a single magnetization 131, the free layer 130 may also include multiple ferromagnetic and/or nonmagnetic layers. For example, the free layer 130 may be a SAF including magnetic layers antiferromagnetically or ferromagnetically coupled through one or more thin layers, such as Ru. The free layer 130 may also be a bilayer. Similarly, the free layer 130 might be a trilayer. In addition, the bilayer and/or trilayer might be repeated in the free layer 130. Other structures for the free layer 130 may also be used. For example, the free layer might include multiple ferromagnetic layers interleaved with one or more capping layer. In this embodiment, the capping layer would be so termed because it resides on a ferromagnetic layer within the free layer 130. A ferromagnetic layer would reside at the top and bottom edges of the free layer 130. Thus, the free layer would include at least two ferromagnetic layers with a capping layer in between.

In the embodiment shown, the free layer has an easy axis along the magnetization 131 shown. The free layer easy axis is, therefore, along the x-axis, in the plane of the free layer 130. The magnetization of the free layer 130 is stable along the easy axis, to the left or to the right in FIG. 2. Thus, the stable magnetic states are those in which the magnetization 131 of the free layer is to the left or right in FIG. 2. Further, the free layer 130 has an out-of-plane demagnetization energy and a perpendicular magnetic anisotropy corresponding to a perpendicular anisotropy energy. In the embodiment shown, the in-plane magnetic anisotropy is substantially parallel to x-y plane of FIG. 2, while the perpendicular magnetic anisotropy is substantially parallel to the z-axis. The perpendicular anisotropy energy that is less than the out-of-plane demagnetization energy for the free layer 130. As a result, the magnetization 131 of the free layer 130 is stable in-plane. The magnetic element 100 is also configured to allow the free layer 130 to be switched between stable magnetic states when a write current is passed through the magnetic element 100. Thus, in the exemplary embodiment depicted in FIG. 2, spin transfer torque may be used to switch the magnetization 131 of the free layer 130 to be parallel or antiparallel to the magnetization 111 of the pinned layer 110.

The perpendicular capping layer 140 is adjacent to the free layer 130. In some embodiments, the perpendicular capping layer 140 adjoins the free layer 130 and a contact (not shown in FIG. 2). The perpendicular capping layer 140 is so named because the perpendicular capping layer 140 is configured to induce at least a portion of the perpendicular magnetic anisotropy in the free layer 130. In some embodiments, the perpendicular capping layer 140 induces the perpendicular magnetic anisotropy substantially without changing the out-of-plane demagnetization energy or the in-plane magnetic anisotropy of the free layer 130. The perpendicular capping layer 140 induces a component of the perpendicular magnetic anisotropy in the free layer 130 throughout use: both during operation and during latency when the magnetic element 100 is in a quiescent state.

The perpendicular capping layer 140 may contribute to the perpendicular magnetic anisotropy of the free layer 130 based on the materials selected. In some embodiments, the perpendicular capping layer 140 is an oxide or nitride such as MgO, NiO, aluminum oxide, silicon oxide, AlN, SiN, TaN, TiN, $RuO_2$ or ITO (indium tin oxide). The oxide or nitride perpendicular capping layer may be doped and/or have a stoichiometry that may reduce the layer's resistance. For example, MgO doped with Ti may be used as the perpendicular capping layer 140. In other embodiments, the perpendicular capping layer 140 is a metal such as Al, Cu, Mg, Ru, Au, Cr, Pt, Pd, Ta or W. However, in such embodiments interdiffusion with the free layer and/or increased damping may need to be considered. The materials used for the perpendicular capping layer 140 may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta or W. In some embodiments, the perpendicular capping layer 140 may be a multilayer. For example, the perpendicular capping layer 140 may be a bilayer having an oxide or nitride layer adjoining the free layer and a metallic layer on the oxide or nitride layer. In one such embodiment, the oxide layer includes MgO and the metallic layer includes Mg. Use of such a bilayer as the perpendicular capping layer 140 may allow use of thinner insulators while providing effective diffusion blocking. In some embodiments of this bilayer the metallic layer may include materials that increase the perpendicular anisotropy of the free layer via stress, such as Ru, Cu, Pt, Pd, Ta, and/or W. In some such embodiments, the additional metallic layer may include materials used to improve spin transfer torque or reduce the overall resistance of the bilayer, for example Al, Au, Mg, and/or Cr. In other embodiments, the perpendicular capping layer 140 may be a trilayer including the materials described above.

In addition to inducing a perpendicular anisotropy in the free layer 130, the perpendicular capping layer 140 may reduce dead magnetic regions, improve the order of the interface, and reduce damping that may otherwise adversely affect performance of the free layer 130. The perpendicular capping layer 140 may also act as a diffusion block and improve the surface quality of the free layer. Further, in some embodiments, the perpendicular capping layer 140 may improve damping by diffusion blocking and a reduction in the spin pump effect. More specifically, because the perpendicular capping layer 140 resides between the free layer 130 and a contact (not shown), the effects of the contact adjoining the free layer 130 may be mitigated or eliminated.

The magnetic element 100 may also include other components not shown in FIG. 2. For example, in addition to seed layers, the magnetic element 100 may include an AFM layer (not shown) adjoining the pinned layer 110 for pinning the magnetization 111 of the pinned layer 110. The magnetic element 100 might include an additional free layer residing between the free layer and the nonmagnetic spacer layer and an additional capping layer residing on the additional free layer and between the additional free layer and the free layer 130. The additional capping layer is configured such that the free layer 130 and the additional free layer (not shown) are antiferromagnetically dipole coupled.

The magnetic element 100 may have improved performance and thermal stability. The perpendicular capping layer 140 is interposed between the free layer 130 and a contact (not shown in FIG. 2). As a result, the perpendicular cap layer 140 may function as a diffusion blocking layer, which improves the interface, reduces or eliminated dead magnetic regions of the free layer 130, and mitigates damping. In addition, when doped materials, such as doped MgO or a bilayer/trilayer such as MgO/Mg are used, the resistance of the perpendicular capping layer 140 is reduced, which may be desirable. Further, the magnetic element 100 may have improved thermal stability due to the perpendicular capping layer 140. More specifically, the perpendicular capping layer 140 increases the perpendicular magnetic anisotropy of the free layer 130. This increase in perpendicular magnetic anisotropy leads to a decrease in the switching current $J_{co}$, without degradation of the thermal stability. This phenomenon may be understood by noting that the switching current density $J_{co}$, in certain limiting cases, may be considered proportional to an "effective moment" $m_{eff}$. This effective moment is used in the expression $4\pi m_{eff}$, which describes the net effect of the actual demagnetizing field $4\pi m_s$ and any perpendicular anisotropy that may be present in the free layer 130. The perpendicular anisotropy contributed by the presence of the perpendicular capping layer 140 decreases $m_{eff}$. Consequently, the switching current density $J_{co}$ and the required write current decrease. On the other hand, the stability of the free layer 130 is limited by thermal fluctuations that are in-plane. The perpendicular anisotropy induced by the perpendicular capping layer 140 does not affect the in-plane behavior of the free layer 130. Thus, the write current may be decreased while the thermal stability maintained. Stated differently, for a given write current, the magnetic element 100 has improved thermal stability. As a result, the magnetic element 100 is less subject to thermal fluctuations and thermal stability may be increased. The magnetic element 100 may thus be more suitable for applications such as STT-RAM. In addition to limiting inter-diffusion and inducing a perpendicular anisotropy as discuss above, in some embodiments, the capping layer 140 may also transmit spin transfer torque between magnetic layers and allow magnetic coupling between layers. In such embodiments, additional configurations of magnetic layers and spin transfer switching may be improved.

Figure 3:
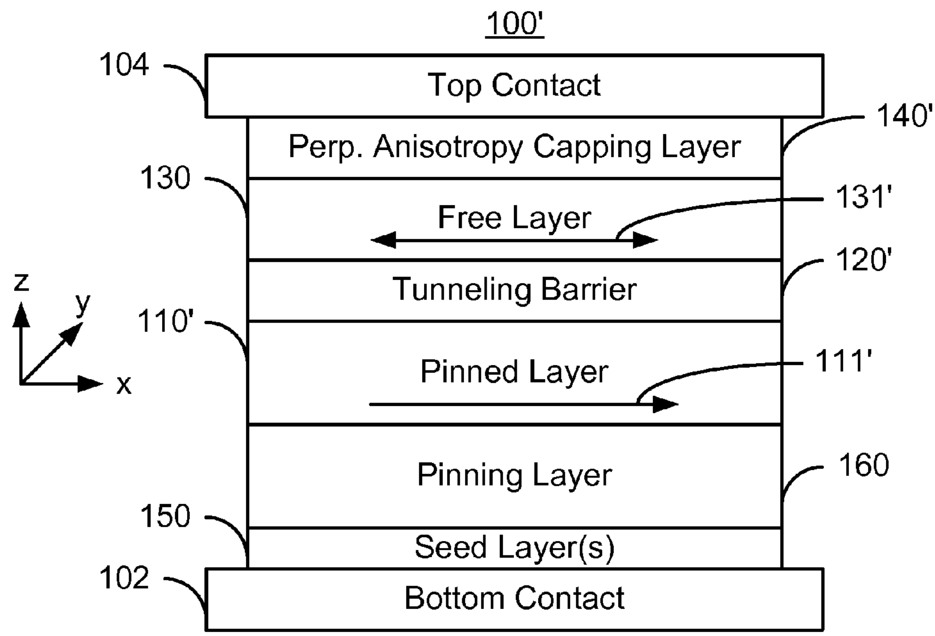
FIG. 3 depicts another exemplary of a magnetic element having improved thermal stability.

FIG. 3 depicts another exemplary of a magnetic element 100' having improved thermal stability. The magnetic element 100' is for use in a magnetic device, such as a magnetic memory, in which current is to be driven through the magnetic element 100'. Consequently, contacts 102 and 104 through which current would be provided to and exit from the magnetic element 100' are shown in FIG. 3. For clarity, FIG. 3 is not drawn to scale and some portions of the magnetic element 100' might be omitted. Further, the magnetic element 100' is analogous to the magnetic element 100 depicted in FIG. 2. Thus, the magnetic element 100' includes a pinned layer 110', a spacer layer 120', a free layer 130', and a perpendicular capping layer 140' that are analogous to the pinned layer 110, the spacer layer 120, the free layer 130, and the perpendicular capping layer 140, respectively. The magnetic element 100 may also include seed layer(s) 150 and pinning layer 160. The seed layer(s) 150 are used to provide the desired surface for growth of the pinning layer 160. In some embodiments, the pinning layer 160 is an AFM, such as IrMn.

The pinned layer 110' and the free layer 130' are magnetic and thus may include one or more of Ni, Fe, and Co, particularly in an alloy form. For simplicity, the pinned layer 110' is shown as having a magnetization 111' and the free layer 130' is shown with magnetization/easy axis 131'. The structure and function of the pinned layer 110' and free layer 130' are analogous to that of the pinned layer 110 and free layer 130, respectively. Thus, the pinned layer 110' and free layer 130' may be SAFS, other multilayers or have other structures. The magnetic element 100' may also include other components not shown in FIG. 3. For example. The magnetic element 100' might include an additional free layer residing between the free layer and the nonmagnetic spacer layer and an additional capping layer residing on the additional free layer and between the additional free layer and the free layer 130'. The additional capping layer is configured such that the free layer 130' and the additional free layer (not shown) are antiferromagnetically dipole coupled.

The free layer 130' has an in-plane magnetic anisotropy, an out-of-plane demagnetization energy, and a perpendicular magnetic anisotropy. The perpendicular magnetic anisotropy corresponds to a perpendicular magnetic energy. In the embodiment shown, the in-plane magnetic anisotropy is substantially parallel to x-y plane of FIG. 3, while the perpendicular magnetic anisotropy is substantially parallel to the z-axis. The out-of-plane demagnetization energy is also greater than the perpendicular anisotropy energy for the free layer 130'. As a result, the magnetization 131' of the free layer 130' is stable in-plane. The magnetic element 100' is also configured to allow the free layer 130' to be switched between stable magnetic states when a write current is passed through the magnetic element 100'. Thus, in the exemplary embodiment depicted in FIG. 3, spin transfer torque may be used to switch the magnetization 131' of the free layer 130'.

In the embodiment shown, the spacer layer 120' is a tunneling barrier layer 120'. In one such embodiment, the tunneling barrier layer 120' may include crystalline MgO, which may enhance the tunneling magnetoresistance (TMR) of the magnetic element 100'.

The perpendicular capping layer 140' adjoins the free layer 130' and the top contact 104. The perpendicular capping layer 140' is configured to induce at least a portion of the perpendicular magnetic anisotropy in the free layer 130'. In the embodiment shown, the perpendicular capping layer 140' induces the perpendicular magnetic anisotropy without substantially changing the in-plane magnetic anisotropy of the free layer 130'. The perpendicular capping layer 140' induces a component of the perpendicular magnetic anisotropy in the free layer 130' throughout use: both during operation and during latency when the magnetic element 100' is in a quiescent state.

The perpendicular capping layer 140' may contribute to the perpendicular anisotropy of the free layer 130' based on the materials selected. These materials are analogous to those used for the perpendicular capping layer 140. The materials used for the perpendicular capping layer 140' may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta or W. In some embodiments, the perpendicular capping layer 140' may be a multilayer. In one such embodiment, the perpendicular capping layer 140' may be a bilayer having an oxide or nitride layer adjoining the free layer and a metallic layer on the oxide or nitride layer. For example, the perpendicular capping layer 140' could include an MgO layer and a metallic layer such as Ru, Mg, or Cr. The perpendicular capping layer 140' may also include a trilayer.

The magnetic element 100' shares the benefits of the magnetic element 100. The magnetic element 100' may have improved performance and thermal stability. The perpendicular capping layer 140' is interposed between the free layer 130' and the contact 104. As a result, the perpendicular cap layer 140' aids in improving the interface, reducing or eliminated dead magnetic regions of the free layer 130', and mitigating damping. In addition, when doped materials, such as doped MgO or a bilayer such as MgO/Mg are used, the resistance of the perpendicular capping layer 140' is reduced, which may be desirable. Further, the magnetic element 100 may have improved thermal stability due to the perpendicular capping layer 140. More specifically, the perpendicular capping layer 140' increases the perpendicular magnetic anisotropy of the free layer 130', which may decrease the write current required substantially without degradation of the thermal stability. As a result, the magnetic element 100' is less subject to thermal fluctuations and thermal stability may be increased. Further, as described above, a reduction in interdiffusion, enhanced spin torque transfer, and desired magnetic coupling may also be achieved. The magnetic element 100' may thus be more suitable for applications such as STT-RAM.

Figure 4:
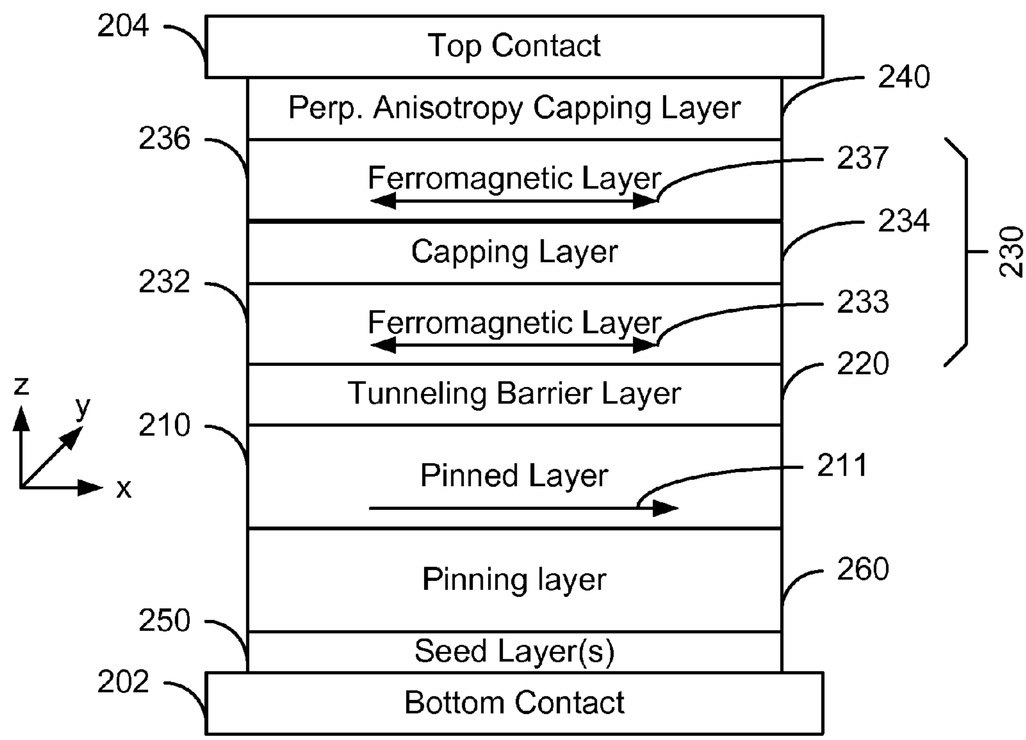
FIG. 4 depicts another exemplary embodiment of a magnetic element having improved thermal stability.

FIG. 4 depicts another exemplary embodiment of a magnetic element 200 having improved thermal stability. The magnetic element 200 is for use in a magnetic device, such as a magnetic memory, in which current is to be driven through the magnetic element 200. Consequently, contacts 202 and 204 through which current would be provided to and exit from the magnetic element 200 are shown in FIG. 4. For clarity, FIG. 4 is not drawn to scale and some portions of the magnetic element 200 might be omitted. Further, the magnetic element 200 is analogous to the magnetic elements 100/100' depicted in FIGS. 2/3. Thus, the magnetic element 200 includes seed layer(s) 250, pinning layer 260, pinned layer 210, spacer layer 220, free layer 230, and perpendicular capping layer 240 that are analogous to the seed layer(s) 150, pinning layer 160, pinned layer 110/110', the spacer layer 120/120', the free layer 130/130', and the perpendicular capping layer 140/140', respectively. The seed layer(s) 250 are used to provide the desired surface for growth of the pinning layer 260. In some embodiments, the pinning layer 260 is an AFM, such as IrMn.

The pinned layer 210 and the free layer 230 are magnetic and thus may include one or more of Ni, Fe, and Co, particularly in an alloy form. For simplicity, the pinned layer 210 is shown as having a magnetization 211. The structure and function of the seed layer(s) 250, pinning layer 260, and pinned layer 210 are analogous to that of the seed layer(s) 150, pinning layer 160, and pinned layer 110/110', respectively. Thus, the pinned layer 210 may be a SAF, other multilayers or have other structures. The magnetic element 200 may also include other components not shown in FIG. 4.

The free layer 230 includes ferromagnetic layers 232 and 236 and capping layer 234. The ferromagnetic layers 232 and 236 have magnetizations 233 and 237, respectively. In the embodiment shown, the capping layer 234 is configured such that the magnetizations 233 and 237 of the ferromagnetic layers 232 and 236, respectively, are ferromagnetically coupled. Thus, the magnetizations 233 and 237 are aligned. In addition, in some embodiments, the capping layer 234 may also affect the perpendicular anisotropy of the ferromagnetic layers 232 and 236 in a way that is similar to the perpendicular capping layers 140 and 140' and the perpendicular anisotropy capping layer 240, described below. Thus, the materials used for the perpendicular capping layer 234 may include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta or W. In this embodiment the perpendicular capping layer 234 is understood to be thin enough to allow either orange-peel ferromagnetic coupling or to mediate ferromagnetic exchange coupling between ferromagnetic layers 232 and 236.

The ferromagnetic layers 232 and 236 of the free layer 230 also have an in-plane magnetic anisotropy, an out-of-plane demagnetization energy, and a perpendicular magnetic anisotropy corresponding to a perpendicular anisotropy energy. In the embodiment shown, the in-plane magnetic anisotropy is substantially parallel to x-y plane of FIG. 4, while the perpendicular magnetic anisotropy is substantially parallel to the z-axis. The out-of-plane demagnetization energy is also greater than the perpendicular anisotropy energy for the ferromagnetic layers 232 and 236 of the free layer 230. As a result, the magnetizations 231 and 237 of the free layer 230 are stable in-plane. The magnetic element 200 is also configured to allow the free layer 230 to be switched between stable magnetic states when a write current is passed through the magnetic element 200. Thus, in the exemplary embodiment depicted in FIG. 4, spin transfer torque may be used to switch the magnetizations 231 and 233 of the free layer 230.

In the embodiment shown, the spacer layer 220 is a tunneling barrier layer 220. In one such embodiment, the tunneling barrier layer 220 may include crystalline MgO, which may enhance the tunneling magnetoresistance (TMR) of the magnetic element 200.

The perpendicular capping layer 240 adjoins the ferromagnetic layer 236 of the free layer 230 and the top contact 204. The perpendicular capping layer 240 is configured to induce at least a portion of the perpendicular magnetic anisotropy in ferromagnetic layer 236 of the free layer 230. In the embodiment shown, the perpendicular capping layer 240 induces the perpendicular magnetic anisotropy substantially without changing the in-plane magnetic anisotropy of the ferromagnetic layer 236 of the free layer 230. The perpendicular capping layer 240 induces a component of the perpendicular magnetic anisotropy in the ferromagnetic layer 236 throughout use: both during operation and during latency when the magnetic element 200 is in a quiescent state.

The perpendicular capping layer 240 may contribute to the perpendicular anisotropy of the free layer 230 based on the materials selected. These materials are analogous to those used for the perpendicular capping layer 140/140'. The materials used for the perpendicular capping layer 240 may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta or W. In some embodiments, the perpendicular capping layer 240 may be a multilayer. In one such embodiment, the perpendicular capping layer 240 may be a bilayer having an oxide or nitride layer adjoining the free layer and a metallic layer on the oxide or nitride layer. For example, the perpendicular capping layer 240 could includes an MgO layer and a metallic layer such as Ru, Mg, or Cr. As discussed above with respect to the perpendicular capping layers 140/140', the perpendicular capping layer 240 may also reduce dead magnetic regions, improve the order of the interface, and reduce damping that may otherwise adversely affect performance of the free layer 230. The perpendicular capping layer 240 may also be a trilayer including the materials described above.

The magnetic element 200 shares the benefits of the magnetic elements 100/100'. The magnetic element 200 may have improved performance and thermal stability. The perpendicular capping layer 240 is interposed between the top ferromagnetic layer 236 of the free layer 230 and the contact 204. As a result, the perpendicular cap layer 240 aids in improving the interface, reducing or eliminated dead magnetic regions of the ferromagnetic layer 236 of the free layer 230, and mitigating damping. In addition, when doped materials, such as doped MgO or a bilayer such as MgO/Mg are used, the resistance of the perpendicular capping layer 240 is reduced, which may be desirable. Further, the magnetic element 200 may have improved thermal stability due to the perpendicular capping layer 240. More specifically, the perpendicular capping layer 240 increases the perpendicular magnetic anisotropy of the ferromagnetic layer 236, which may decrease the write current required substantially without degradation of the thermal stability. Because they are ferromagnetically coupled, the ferromagnetic layer 232 and the ferromagnetic layer 236 tend to switch together. Thus, the switching current of the free layer 230 may be reduced substantially without adversely affecting the thermal stability of the free layer 230. As a result, the magnetic element 200 is less subject to thermal fluctuations and thermal stability may be increased. Further, as described above, a reduction in inter-diffusion, spin transfer torque transmission, and desired magnetic coupling may also be achieved between the layers 232 and 236.The magnetic element 200 may thus be more suitable for applications such as STT-RAM.

Figure 5:
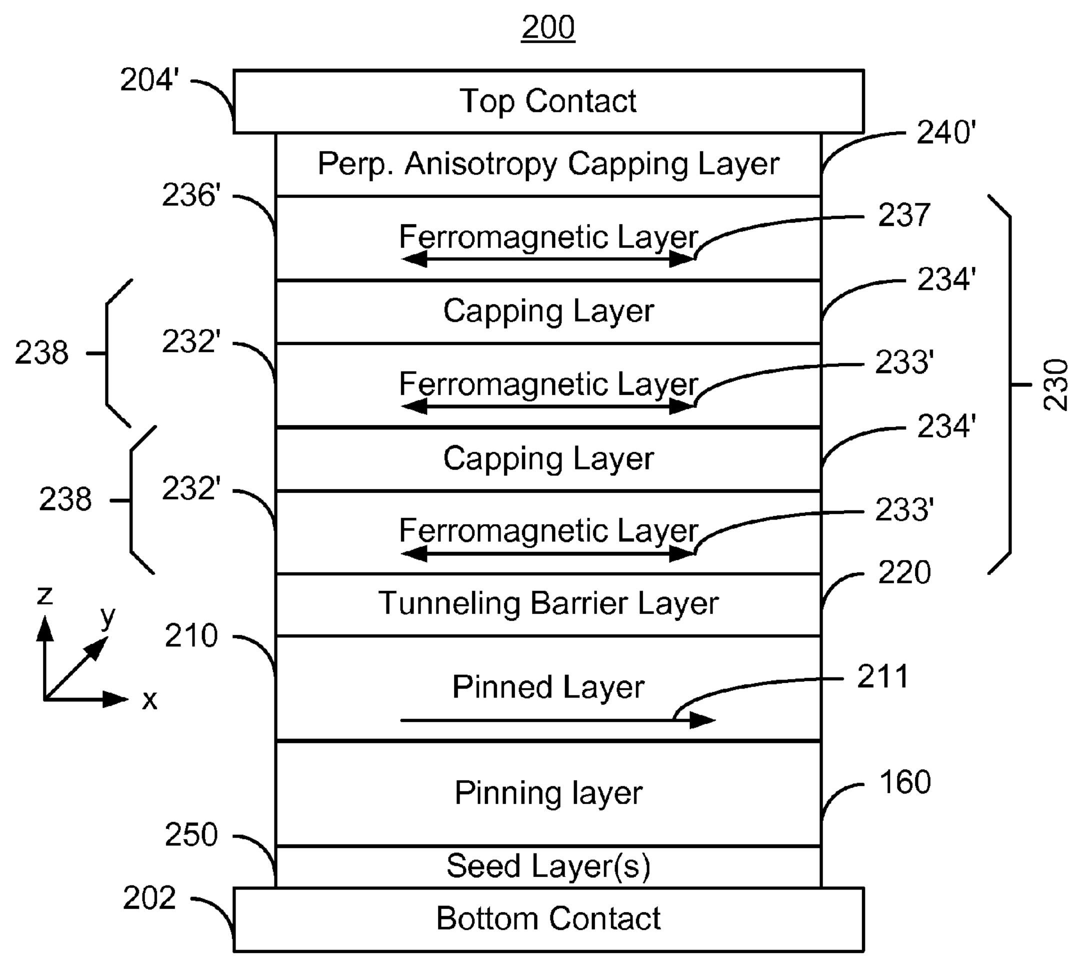
FIG. 5 depicts another exemplary embodiment of a magnetic element having improved thermal stability.

FIG. 5 depicts another exemplary embodiment of a magnetic element 200' having improved thermal stability. The magnetic element 200' is for use in a magnetic device, such as a magnetic memory, in which current is to be driven through the magnetic element 200'. Consequently, contacts 202' and 204' through which current would be provided to and exit from the magnetic element 200' are shown in FIG. 5. For clarity, FIG. 5 is not drawn to scale and some portions of the magnetic element 200' might be omitted. Further, the magnetic element 200' is analogous to the magnetic elements 100/100'/200 depicted in FIGS. 2-4. Thus, the magnetic element 200' includes seed layer(s) 250', pinning layer 260', pinned layer 210', spacer layer 220', free layer 230', and perpendicular capping layer 240' that are analogous to the seed layer(s) 150/250, pinning layer 160/260, pinned layer 110/110'/210, the spacer layer 120/120'/220, the free layer 130/130'/230, and the perpendicular capping layer 140/140'/240, respectively.

The magnetic element 200' is essentially identical to the magnetic element 200. However, the free layer 230' includes multiple repeats of the ferromagnetic layer 232 and capping layer 234 shown in FIG. 4. Referring back to FIG. 5, two repeats of the bilayer 238 are shown. Each bilayer 238 includes a ferromagnetic layer 232' and a capping layer 234'. The two ferromagnetic layers 232' and the ferromagnetic layer 236' are all ferromagnetically coupled. Although two repeats of the bilayer 238 are shown in FIG. 5, another number of repeats might be provided. The capping layer 234' may also increase the perpendicular anisotropy of ferromagnetic layer 232' in a manner analogous to the capping layer 234.

The magnetic element 200' shares the benefits of the magnetic elements 100/100'/200. The magnetic element 200' may have improved performance and thermal stability. The perpendicular capping layer 240' is interposed between the top ferromagnetic layer 236' of the free layer 230' and the contact 204'. As a result, the perpendicular cap layer 240' aids in improving the interface, reducing or eliminated dead magnetic regions of the ferromagnetic layer 236', and mitigating damping. In addition, when doped materials, such as doped MgO or a bilayer such as MgO/Mg are used, the resistance of the perpendicular capping layer 240' is reduced, which may be desirable. Further, the magnetic element 200' may have improved thermal stability due to the perpendicular capping layer 240'. More specifically, the perpendicular capping layer 240' increases the perpendicular magnetic anisotropy of the ferromagnetic layer 236', which may decrease the write current required substantially without degradation of the thermal stability. Thus, the switching current of the free layer 230' may be reduced substantially without adversely affecting the thermal stability of the free layer 230'. As a result, the magnetic element 200' is less subject to thermal fluctuations and thermal stability may be increased. The magnetic element 200' may thus be more suitable for applications such as STT-RAM.

Figure 6:
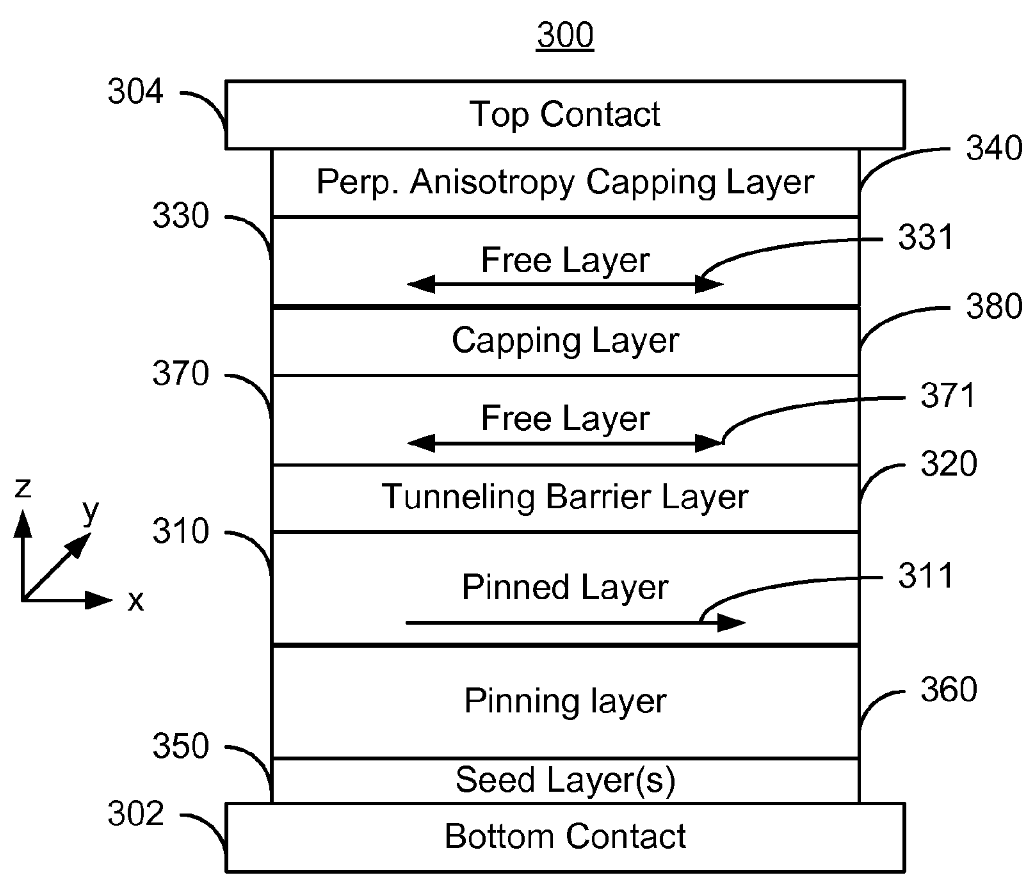
FIG. 6 depicts another exemplary embodiment of a magnetic element having improved thermal stability.

FIG. 6 depicts another exemplary embodiment of a magnetic element 300 having improved thermal stability. The magnetic element 300 is for use in a magnetic device, such as a magnetic memory, in which current is to be driven through the magnetic element 300. Consequently, contacts 302 and 304 through which current would be provided to and exit from the magnetic element 300 are shown in FIG. 6. For clarity, FIG. 6 is not drawn to scale and some portions of the magnetic element 300 might be omitted. Further, the magnetic element 300 is analogous to the magnetic elements 100/100'/200/200' depicted in FIGS. 2-5. Thus, the magnetic element 300 includes seed layer(s) 350, pinning layer 360, pinned layer 310, spacer layer 320, free layer 330, and perpendicular capping layer 340 that are analogous to the seed layer(s) 150/250/250', pinning layer 160/260/260', pinned layer 110/110'/210/210', the spacer layer 120/120'/220/220', the free layer 130/130'/230/230', and the perpendicular capping layer 140/140'/240/240', respectively. The seed layer(s) 350 are used to provide the desired surface for growth of the pinning layer 360. In some embodiments, the pinning layer 360 is an AFM, such as IrMn.

The pinned layer 310 and the free layer 330 are magnetic and thus may include one or more of Ni, Fe, and Co, particularly in an alloy form. For simplicity, the pinned layer 310 is shown as having a magnetization 311. The structure and function of the seed layer(s) 350, pinning layer 360, and pinned layer 310 are analogous to that of the seed layer(s) 150/250/250', pinning layer 160/260/260', and pinned layer 110/110'/210/210', respectively. Thus, the pinned layer 310 may be a SAF, other multilayers or have other structures. The magnetic element 300 may also include other components not shown in FIG. 5.

In the embodiment shown, the spacer layer 320 is a tunneling barrier layer 320. In one such embodiment, the tunneling barrier layer 320 may include crystalline MgO, which may enhance the tunneling magnetoresistance (TMR) of the magnetic element 300.

The free layer 330 is analogous to the free layers 130/130'/230/230'. Although shown as a simple (single) layer, the free layer 230 may include multiple layers. For example, the free layer 330 may be analogous to the free layers 230/230', including multiple ferromagnetically coupled ferromagnetic layers. The free layer 320 is, however, magnetically coupled with the free layer 370, described below.

The magnetic element 300 also includes an additional free layer 370 depicted as having magnetization 371 and an additional capping layer 380. The additional free layer 370 lies between the free layer 330 and the tunneling barrier layer 320. Although shown as a simple layer, the additional free layer 380 may include multiple layers, for example a SAF including multiple ferromagnetic layers (not shown) interleaved with nonmagnetic layers (not shown). The ferromagnetic layers might be ferromagnetically coupled or antiferromagnetically coupled. The additional capping layer 380 resides on the additional free layer 370 and between the additional free layer 370 and the free layer 330. The additional capping layer 380 is configured such that the magnetization 331 of the free layer 330 and the magnetization 371 of the additional free layer 370 are magnetically coupled. In the embodiment shown, the magnetizations 331 and 371 are antiferromagnetically dipole coupled. Further, the capping layer 380 may also affect the perpendicular anisotropy of the ferromagnetic layers 370 and 330 in a way that is similar to the perpendicular capping layers 140, 140', 240, and 240'. The materials used for the perpendicular capping layer 380 may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta or W. In one such embodiment the perpendicular capping layer 380 is thin enough to allow significant antiferromagnetic dipole coupling between ferromagnetic layers 370 and 330.

The free layers 330 and 370 also have an in-plane magnetic anisotropy, an out-of-plane demagnetization energy and a perpendicular magnetic anisotropy corresponding to a perpendicular anisotropy energy. In the embodiment shown, the in-plane magnetic anisotropy is substantially parallel to x-y plane of FIG. 6, while the perpendicular magnetic anisotropy is substantially parallel to the z-axis. The out-of-plane demagnetization energy is also greater than the perpendicular anisotropy energy for the free layers 330 and 370. As a result, the magnetizations 331 and 371 of the free layers 330 and 370 are stable in-plane. The magnetic element 300 is also configured to allow the free layers 330 and 370 to be switched between stable magnetic states when a write current is passed through the magnetic element 300. Thus, in the exemplary embodiment depicted in FIG. 6, spin transfer torque may be used to switch the magnetizations 331 and 371 of the free layers 330 and 370.

The perpendicular capping layer 340 adjoins the free layer 330 and the top contact 304. The perpendicular capping layer 340 is configured to induce at least a portion of the perpendicular magnetic anisotropy in the free layer 330. In the embodiment shown, the perpendicular capping layer 340 induces the perpendicular magnetic anisotropy substantially without changing the in-plane magnetic anisotropy of the free layer 330. The perpendicular capping layer 340 induces a component of the perpendicular magnetic anisotropy in the free layer 330 throughout use: both during operation and during latency when the magnetic element 300 is in a quiescent state.

The perpendicular capping layer 340 may contribute to the perpendicular anisotropy of the free layer 330 based on the materials selected. These materials are analogous to those used for the perpendicular capping layer 140/140'/240/240'. The materials used for the perpendicular capping layer 340 may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta or W. In some embodiments, the perpendicular capping layer 340 may be a multilayer. In one such embodiment, the perpendicular capping layer 340 may be a bilayer having an oxide or nitride layer adjoining the free layer and a metallic layer on the oxide or nitride layer. For example, the perpendicular capping layer 340 could include an MgO layer and a metallic layer such as Ru, Mg, or Cr. As discussed above with respect to the perpendicular capping layers 140/140'/240/240', the perpendicular capping layer 340 may also reduce dead magnetic regions, improve the order of the interface, and reduce damping that may otherwise adversely affect performance of the free layer 330.The perpendicular capping layer 340 may also be a trilayer including the materials described above.

The magnetic element 300 shares the benefits of the magnetic elements 100/100'/200/200'. The magnetic element 300 may have improved performance and thermal stability. The perpendicular capping layer 340 is interposed between the free layer 330 and the contact 304. As a result, the perpendicular cap layer 340 aids in improving the interface, reducing or eliminated dead magnetic regions of the free layer 330, and mitigating damping. In addition, when doped materials, such as doped MgO or a bilayer such as MgO/Mg are used, the resistance of the perpendicular capping layer 340 is reduced, which may be desirable. Further, the magnetic element 300 may have improved thermal stability due to the perpendicular capping layer 340. More specifically, the perpendicular capping layer 340 increases the perpendicular magnetic anisotropy of the free layer 330, which may decrease the write current required substantially without degradation of the thermal stability. Because they are antiferromagnetically coupled, the free layer 330 and the free layer 370 tend to switch together. Thus, the switching current of the free layers 330 and thus 370 may be reduced substantially without adversely affecting the thermal stability of the free layer 330. As a result, the magnetic element 300 is less subject to thermal fluctuations and thermal stability may be increased. The magnetic element 300 may thus be more suitable for applications such as STT-RAM.

Figure 7:
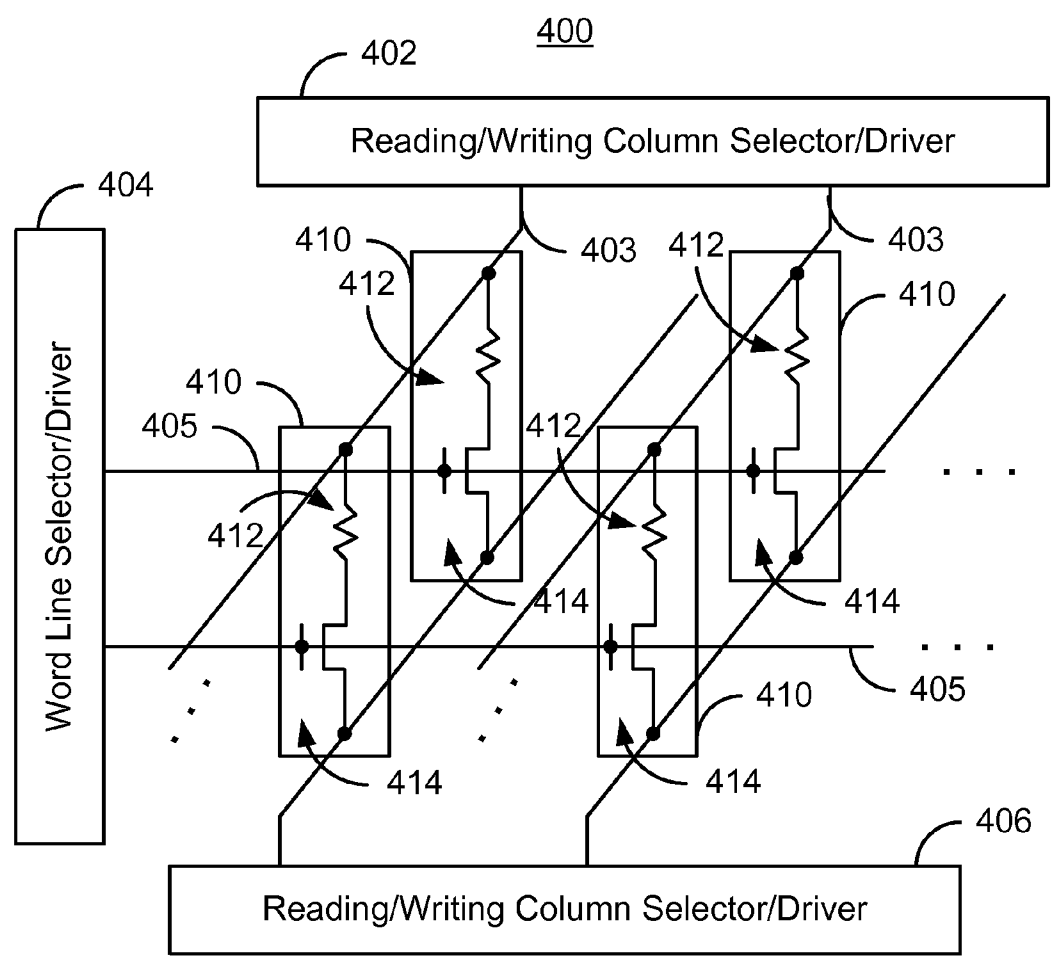
FIG. 7 depicts an exemplary embodiment of a magnetic memory utilizing a magnetic element having improved thermal stability.

FIG. 7 depicts an exemplary embodiment of a portion of a magnetic memory 400 utilizing a magnetic element having improved thermal stability. In the embodiment shown, the magnetic memory is a STT-RAM 400. The STT-RAM 400 includes reading/writing column selector/drivers 402 and 406 as well as word line selector/driver 404. The STT-RAM 400 also includes memory cells 410 including a magnetic element 412 and a selection/isolation device 414. The magnetic element 412 may be any magnetic elements 100/100'/200/200'/300. The reading/writing column selector/drivers 402 and 406 may be used to selectively drive current through the bit lines 403 and thus the cells 410. The word line selector/driver 104 selectively enables row(s) of the STT-RAM 400 by enabling the selection/isolation device 414 coupled with the selected word line 405. In the embodiment shown, the additional magnetic field used in writing may be provided by the bit lines 403.

Because the STT-RAM 400 may use the magnetic elements 100/100'/200/200'/300, the STT-RAM 400 may utilize a lower write current while maintaining the stability of the data stored in memory cells 400. Consequently, performance of the STT-RAM 400 may be improved.

Figure 8:
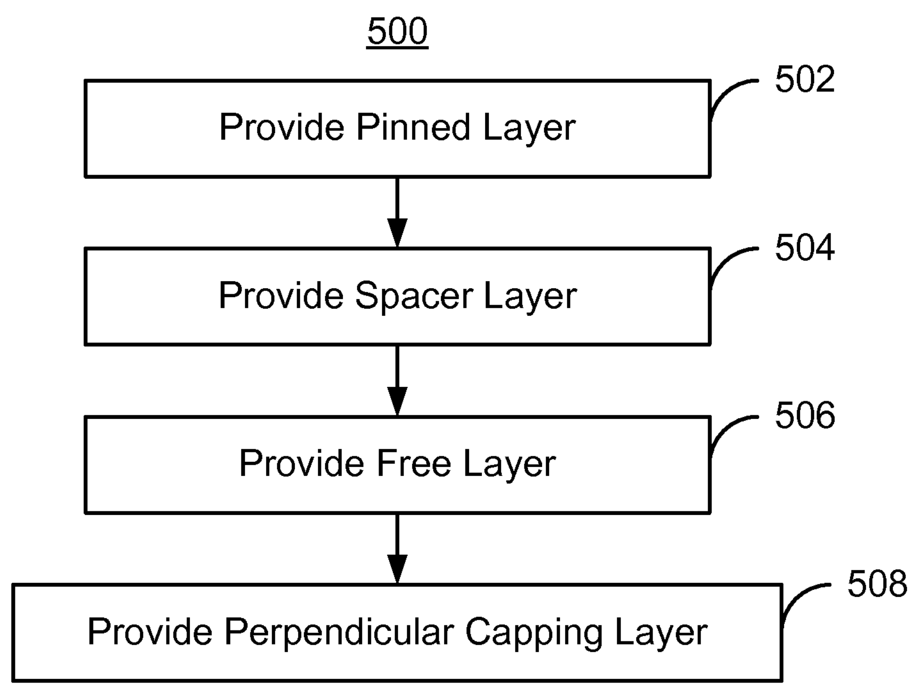
FIG. 8 depicts an exemplary embodiment of a method for fabricating magnetic element having improved thermal stability.

FIG. 8 depicts an exemplary embodiment of a method 500 for fabricating magnetic element having improved thermal stability. The method 500 is described in the context of the magnetic element 100. However, the method 500 may be used for other magnetic elements including but not limited to the magnetic elements 100', 200, 200', and 300. A pinned layer 110 is provided, via step 502. The spacer layer 120 is provided, via step 504. The free layer 130 is provided, via step 506. In one embodiment, step 506 includes depositing multiple layers, such as for the free layers 200 and 200'. The free layer 130 has an in-plane magnetic anisotropy, an out-of-plane demagnetization energy and a perpendicular magnetic anisotropy that corresponds to a perpendicular anisotropy energy. The out-of-plane demagnetization energy is greater than the perpendicular anisotropy energy.

The method 500 also includes providing the perpendicular pinned layer 140, via step 508. The perpendicular capping layer 130 adjoins the free layer 130 and the contact for the magnetic device of which the magnetic element 100 is a part. The perpendicular capping layer 140 induces at least a portion of the perpendicular magnetic anisotropy in the free layer 130. The magnetic element 100 is configured to allow the free layer 130 to be switched between a plurality of stable magnetic states when a write current is passed through the magnetic element 100. Using the method 500, the magnetic element 100, 100', 200, 200', and/or 300 may be fabricated. Consequently, the benefits of the magnetic element may be achieved.

A method and system for providing a magnetic memory element and memory fabricated using the magnetic memory element has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic element for use in a magnetic device including a contact electrically coupled to the magnetic element, the magnetic element comprising:

a pinned layer;

a nonmagnetic spacer layer;

a free layer having an out-of-plane demagnetization energy and a perpendicular magnetic anisotropy corresponding to a perpendicular anisotropy energy, the nonmagnetic spacer layer residing between the pinned layer and the free layer; and a perpendicular capping layer adjoining the free layer and the contact, the perpendicular capping layer inducing at least a portion of the perpendicular magnetic anisotropy in the free layer; without substantially changing an in-plane magnetic anisotropy of the free layer, the perpendicular capping layer being free of Pt, Pd, Cr, Au and Cu if the perpendicular capping layer is metallic, the perpendicular capping layer being free of Ta and residing between the free layer and the contact;

wherein the magnetic element is configured to allow the free layer to be switched between a plurality of stable magnetic states when a write current is passed through the magnetic element.

2. The magnetic element of claim 1 wherein the nonmagnetic spacer layer is a tunneling barrier layer.

3. The magnetic element of claim 2 wherein at least one of the free layer and the pinned layer includes a plurality of layers.

4. The magnetic element of claim 2 wherein the free layer further includes:

a plurality of ferromagnetic layers; and at least one capping layer, the plurality of ferromagnetic layers being interleaved with the at least one capping layer such that a ferromagnetic layer of the plurality of ferromagnetic layers resides at an edge of the free layer, each of the at least one capping layer being configured such that the plurality of ferromagnetic layers are ferromagnetically coupled.

5. The magnetic element of claim 2 further comprising:

an additional free layer residing between the free layer and the nonmagnetic spacer layer; and an additional capping layer residing on the additional free layer and between the additional free layer and the free layer, the additional perpendicular capping layer being configured such that the free layer and the additional free layer are antiferromagnetically dipole coupled.

6. The magnetic element of claim 1 wherein the perpendicular capping layer includes at least one of an oxide layer and a nitride layer.

7. The magnetic element of claim 6 wherein the perpendicular capping layer further includes at least one of MgO, NiO, aluminum oxide, silicon oxide, AlN, SiN, TaN, TiN, $RuO_2$ and indium tin oxide.

8. The magnetic element of claim 1 wherein the perpendicular capping layer further includes at least one of a doped oxide nitride layer.

9. The magnetic element of claim 1 wherein the perpendicular capping layer further includes Ti-doped MgO.

10. The magnetic element of claim 1 wherein the perpendicular capping layer is metallic.

11. The magnetic element of claim 10 wherein the perpendicular capping layer includes at least one of Al, Cu, Mg, Ru, and W.

12. The magnetic element of claim 1 wherein the perpendicular capping layer is at least one of a bilayer and a trilayer.

13. The magnetic element of claim 12 wherein the at least one of the bilayer and trilayer includes a first layer and a second layer, the first layer including of MgO and the second layer consists of at least one of Ru, Mg, Cr, or W.

14. The magnetic element of claim 1 wherein the perpendicular capping layer further includes at least one of crystalline MgO, doped MgO, NiO, aluminum oxide, silicon oxide, AlN, SiN, TiN, $RuO_2$, indium tin oxide, Al, Cu, Mg, Ru, Au, Cr, Pt, Pd, or W.

15. The magnetic element of claim 1 wherein the perpendicular capping layer is an insulator.

16. The magnetic element of claim 1 wherein the perpendicular Capping layer is a tunneling barrier layer.

17. A magnetic element for use in a magnetic device including a contact electrically coupled to the magnetic element, the magnetic element comprising:

a pinned layer;

a tunneling barrier layer including crystalline MgO;

a free layer having an in-plane magnetic anisotropy, an out-of-plane demagnetization energy and a perpendicular magnetic anisotropy corresponding to a perpendicular anisotropy energy, the tunneling barrier layer residing between the pinned layer and the free layer; and a perpendicular capping layer adjoining the free layer and the contact, the perpendicular capping layer being between the free layer and the contact,the perpendicular capping layer inducing at least a portion of the perpendicular magnetic anisotropy in the free layer substantially without changing the in-plane magnetic anisotropy, the perpendicular capping layer including at least one of crystalline MgO and doped crystalline MgO;

wherein the magnetic element is configured to allow the free layer to be switched between a plurality of stable magnetic states when a write current is passed through the magnetic element.

18. The magnetic element of claim 17 comprising:

an additional free layer residing between the free layer and the spacer layer; and an additional capping layer residing on the additional free layer and between the additional free layer and the free layer, the additional perpendicular capping layer being configured such that the free layer and the additional layer are antiferromagnetically dipole coupled.

19. The magnetic element of claim 1 wherein the perpendicular anisotropy energy of the free layer is less than the out-of-plane demagnetization energy of the free layer.

20. The magnetic element of claim 17 wherein the perpendicular anisotropy energy of the free layer is less than the out-of-plane demagnetization energy of the free layer.

* * * * *